(12) United States Patent
Hickerson et al.

(10) Patent No.: US 9,648,420 B2
(45) Date of Patent: *May 9, 2017

(54) RECTIFIER CIRCUIT FOR MONITORING DC OFFSET OF A SINGLE-SUPPLY AUDIO POWER AMPLIFIER

(71) Applicant: Panasonic Automotive Systems Company of America, Division of Panasonic Corporation of North America, Peachtree City, GA (US)

(72) Inventors: Dallas Dwight Hickerson, Sharpsburg, GA (US); Kenneth Dale Finlon, Fayetteville, GA (US)

(73) Assignee: Panasonic Automotive Systems Company of America, Division of Panasonic Corporation of North America, Peachtree City, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/164,404

(22) Filed: May 25, 2016

(65) Prior Publication Data

US 2016/0269826 A1   Sep. 15, 2016

Related U.S. Application Data

(63) Continuation of application No. 14/223,445, filed on Mar. 24, 2014, now Pat. No. 9,379,681.

(51) Int. Cl.
| | | |
|---|---|---|
| *H03G 11/00* | (2006.01) | |
| *H04R 3/00* | (2006.01) | |
| *H03F 5/00* | (2006.01) | |
| *H03F 1/52* | (2006.01) | |
| *H03F 3/185* | (2006.01) | |
| *H03F 3/45* | (2006.01) | |
| *H03F 3/181* | (2006.01) | |
| *H03F 3/20* | (2006.01) | |
| *H04R 3/12* | (2006.01) | |

(52) U.S. Cl.
CPC ............... *H04R 3/007* (2013.01); *H03F 1/52* (2013.01); *H03F 3/181* (2013.01); *H03F 3/185* (2013.01); *H03F 3/20* (2013.01); *H03F 3/45475* (2013.01); *H03F 5/00* (2013.01); *H04R 3/00* (2013.01); *H04R 3/12* (2013.01); *H03F 2200/99* (2013.01); *H04R 2499/13* (2013.01)

(58) Field of Classification Search
CPC ........ H03F 1/52; H03F 3/185; H03F 3/45475; H03F 3/181; H03F 3/20; H03F 2200/99; H04R 2499/13; H04R 3/00; H04R 3/007; H04R 3/12
See application file for complete search history.

(56) References Cited

U.S. PATENT DOCUMENTS

| | | | | |
|---|---|---|---|---|
| 4,887,298 A | * | 12/1989 | Haigler | H03G 3/301 330/207 P |
| 5,369,371 A | * | 11/1994 | Eaton | G01R 27/025 324/551 |
| 2011/0045874 A1 | * | 2/2011 | Ku | H04M 1/6016 455/569.1 |

* cited by examiner

*Primary Examiner* — Regina N Holder
(74) *Attorney, Agent, or Firm* — Laurence S. Roach, Esq.

(57) ABSTRACT

An audio power amplifier arrangement includes an audio power amplification integrated circuit having two loudspeaker outputs. A rectifier circuit includes a first diode having a cathode connected to one of the two loudspeaker outputs and an anode connected to a rectifier output node. A second diode has an anode connected to the one loudspeaker output. A first resistor has a first end connected to a cathode of the second diode and a second end connected to the rectifier output node. A capacitor has a first end connected to the rectifier output node and a second end connected to electrical ground. A second resistor has a first end connected to the rectifier output node and a second end connected to electrical ground.

20 Claims, 5 Drawing Sheets

RECTIFIER CIRCUIT FOR MONITORING DC OFFSET OF A SINGLE-SUPPLY AUDIO POWER AMPLIFIER

CROSS-REFERENCE TO RELATED APPLICATION

This application is a continuation application of U.S. patent application Ser. No. 14/223,445, filed on Mar. 24, 2014 which is currently under allowance, the disclosure of which is hereby incorporated by referenced in its entirety for all purposes.

BACKGROUND OF THE INVENTION

1. Field of the Invention

The present invention relates to a circuit for monitoring an audio output signal, and, more particularly, to a circuit for monitoring DC Offset in an audio output signal.

2. Description of the Related Art

The presence of Output DC Offset is a fault condition which can occur in audio power amplifiers. Typical loudspeakers employing a voice coil-magnet combination with a paper cone are quite susceptible to damage by DC Offset, so this potential condition should be avoided if at all possible. Automotive power amplifiers often employ integral DC Offset detection, but this feature may test for this condition only at initial power-up (e.g., "Turn-On Diagnostics"). If a fault condition occurs after "turn-on," the fault condition may remain undetected and component damage may occur.

The DC Offset detection may prevent smoke emission, ignition and other defects caused by a short-circuit of an audio power amplification IC input that drives a speaker. A DC offset may result due to a short-circuit 10 (FIG. 1) caused by an adhesion of burrs between a ground (GND) terminal 12 and an input signal terminal 14 which are neighboring or adjacent to each other in an audio power amplification integrated circuit (IC) 16. As a result of the short circuiting burr, the voltage at input signal terminal 14 becomes low, and a voltage difference develops between terminal 14 and terminal 18. With a standard internal voltage applied at node 19, the voltage difference becomes amplified by amplifier 20, and a DC voltage develops across terminals 22, 24. Terminal 24 may be the negative speaker output and terminal 22 may be the positive speaker output. Thus, the DC voltage on terminal 24 may be higher than the voltage on terminal 22. As a consequence of the DC offset, DC current flows into a speaker 26 and a voice coil part (not shown) in speaker 26 generates heat, which causes defects such as smoke emission and ignition.

This defect cannot be prevented by a protection function for an output short-circuit such as thermal shut down or over-current detection. It is impossible to detect the defect even using 4A over-current detection mounted in an IC. The most effective known way to prevent the defect by a design is to use DC-OFFSET detection function.

As described above, the prior art includes an audio power amplification IC with a DC-OFFSET detect function. However, integral DC Offset detection typically has technical limitations, and the presence of this feature within the power amplifier IC increases the cost of the device.

SUMMARY OF THE INVENTION

The circuit of the invention may provide an inexpensive means of constantly monitoring the audio output to detect DC Offset. A simple and inexpensive diode rectifier is connected to the audio amplifier's speaker outputs with component values chosen such that 1) normal audio does not produce a false indication of DC Offset, 2) the detection of actual DC Offset is reliable, even in the presence of an audio input signal, and 3) audio fidelity is not affected. The output of the diode rectifier is monitored by a micro-controller's Analog-to-Digital converter, which is commonly found in automotive audio products.

The invention comprises, in one form thereof, an audio power amplifier arrangement including an audio power amplification integrated circuit having two loudspeaker outputs. A rectifier circuit includes a first diode having a cathode connected to one of the two loudspeaker outputs and an anode connected to a rectifier output node. A second diode has an anode connected to the one loudspeaker output. A first resistor has a first end connected to a cathode of the second diode and a second end connected to the rectifier output node. A capacitor has a first end connected to the rectifier output node and a second end connected to electrical ground. A second resistor has a first end connected to the rectifier output node and a second end connected to electrical ground.

The invention comprises, in another form thereof, an audio power amplifier arrangement including an audio power amplification integrated circuit having a loudspeaker output. A rectifier circuit includes a first diode having a cathode connected to the loudspeaker output and an anode connected to a rectifier output node. A second diode has an anode connected to the loudspeaker output. A resistor has a first end connected to a cathode of the second diode and a second end connected to the rectifier output node. A capacitor has a first end connected to the rectifier output node and a second end connected to electrical ground. Detecting means detects that a voltage at the rectifier output node is above a threshold level.

The invention comprises, in yet another form thereof, a method of processing an audio signal, including inputting the audio signal into a power amplification integrated circuit having a loudspeaker output. A rectifier circuit is connected to the loudspeaker output. The rectifier circuit includes a first diode having a cathode connected to the loudspeaker output and an anode connected to a rectifier output node. A second diode has an anode connected to the loudspeaker output. A resistor has a first end connected to a cathode of the second diode and a second end connected to the rectifier output node. A capacitor has a first end connected to the rectifier output node and a second end connected to electrical ground. It is detected that a voltage at the rectifier output node is above a threshold level.

An advantage of the present invention is that it may enable detection of undesirable Output DC Offset of an audio power amplifier in order to prevent damage to the system's loudspeaker(s), even in the presence of input signals.

BRIEF DESCRIPTION OF THE DRAWINGS

The above-mentioned and other features and objects of this invention, and the manner of attaining them, will become more apparent and the invention itself will be better understood by reference to the following description of embodiments of the invention taken in conjunction with the accompanying drawings, wherein.

DETAILED DESCRIPTION

The embodiments hereinafter disclosed are not intended to be exhaustive or limit the invention to the precise forms disclosed in the following description. Rather the embodiments are chosen and described so that others skilled in the art may utilize its teachings.

Figure 1:
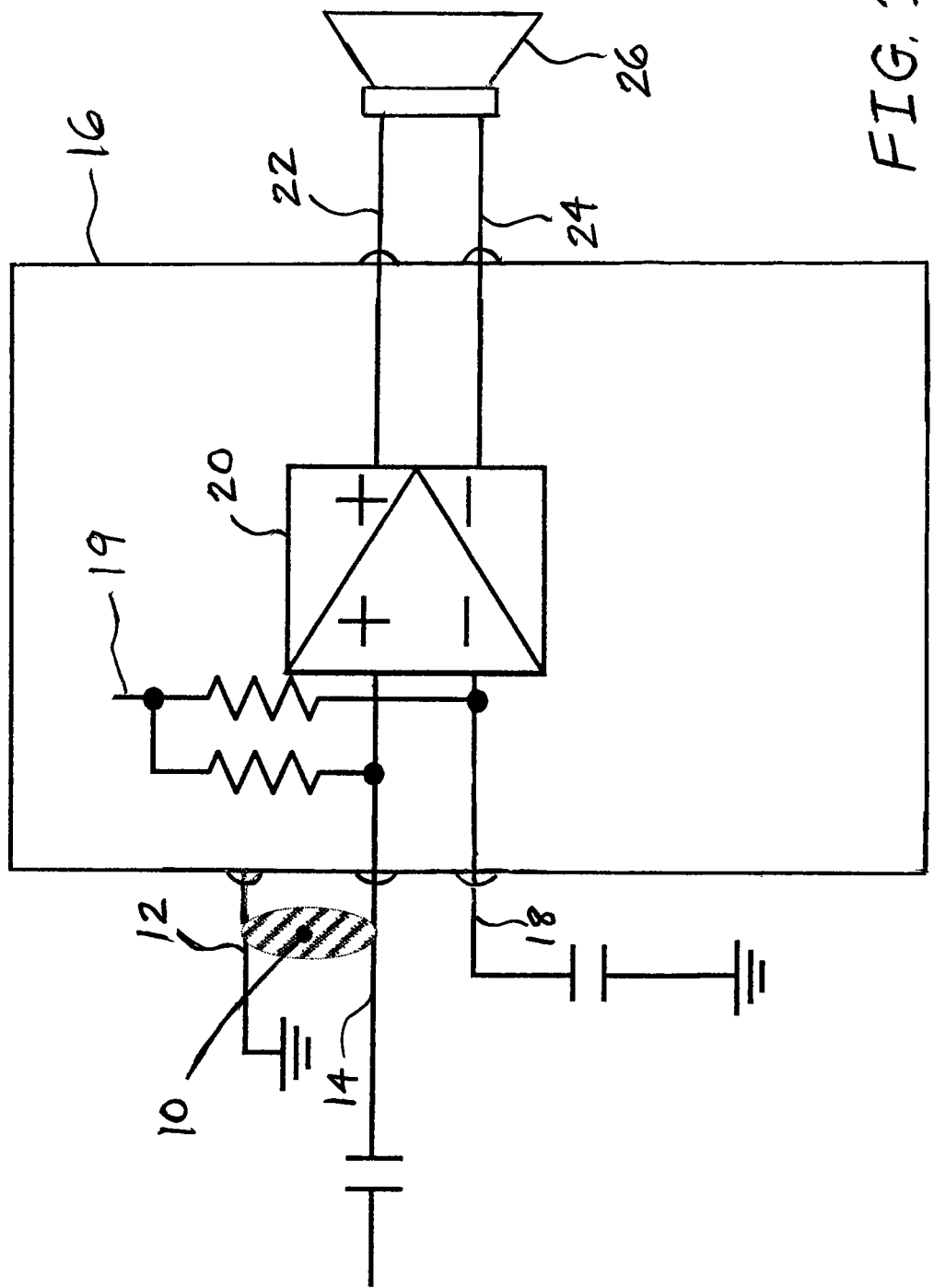
FIG. 1 is a schematic diagram of an audio power amplifier circuit of the prior art.
Figure 2:
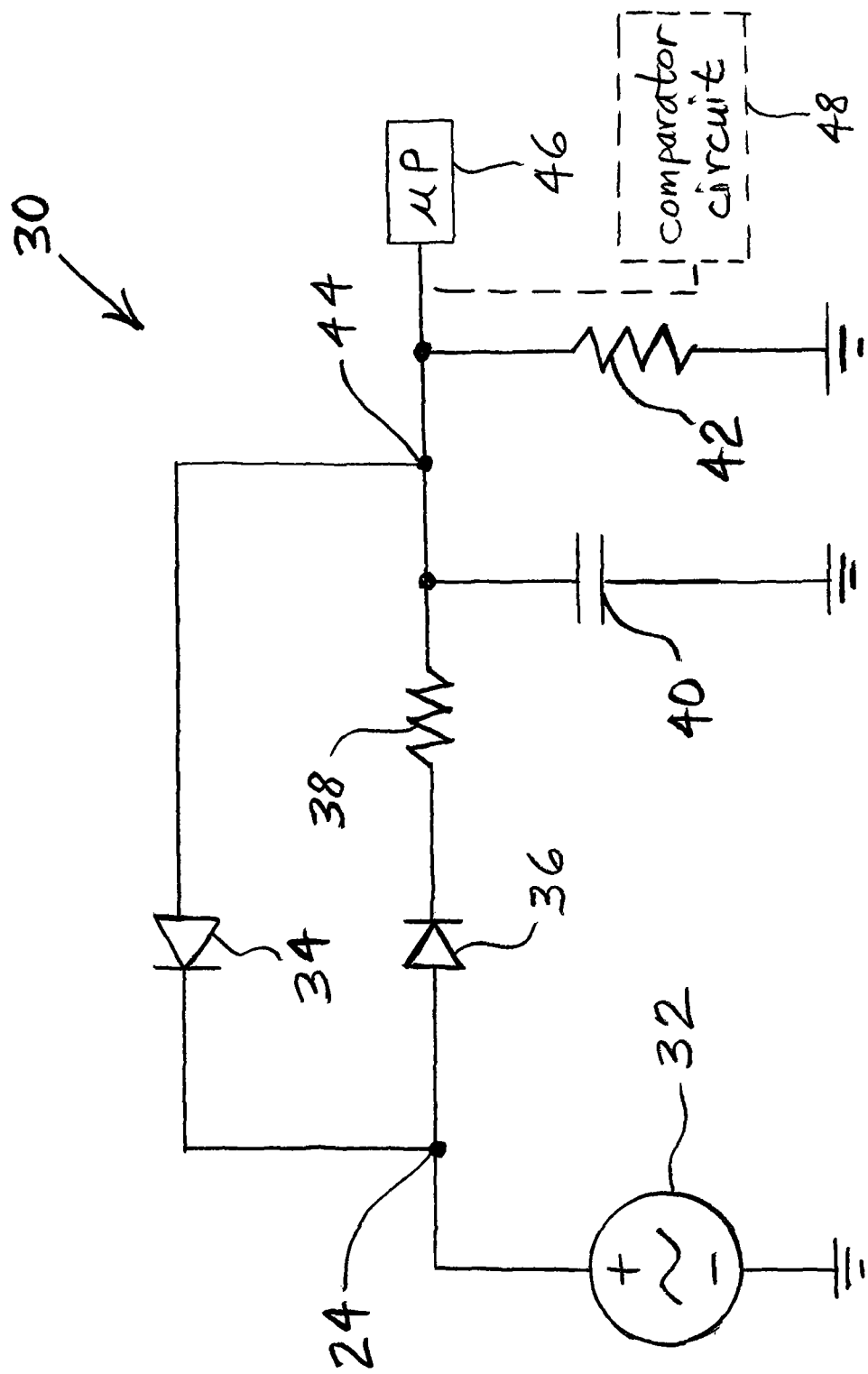
FIG. 2 is a schematic diagram of a rectifier circuit of the present invention for audio DC Offset detection.

FIG. 2 illustrates one embodiment of a rectifier circuit 30 for monitoring the DC output of an audio channel connected to node 24. Circuit 30 includes a schematically-generated signal generator 32 which may represent the audio signal generated on node 24 in FIG. 1. For testing or simulation purposes, signal generator 32 may be in the form of a square wave generator or a sine wave generator, for example. Circuit 30 also includes two diodes 34, 36 connected in parallel. As shown, a cathode of diode 34 is connected to node 24, and an anode of diode 36 is connected to node 24. Diodes 34, 36 may be standard silicon switching diodes, such as model number 1N4148 or model number 1N914. A resistor 38 may have a value of 150,000 ohms, for example; a capacitor 40 may have a value of 4.7 microfarads, for example; and a resistor 42 may have a value of 47,000 ohms, for example.

As mentioned above, the input node 24 of rectifier circuit 30 is connected to the negative (-) speaker output of each channel that is being monitored. Under normal conditions, the audio positive peaks may charge capacitor 40 through diode 36 and resistor 38, but this accumulated change may be rapidly discharged through diode 34 by the audio negative peaks. The presence of resistor 38 may enable the capacitor's discharge time to be much less than its charge time.

Figure 3:
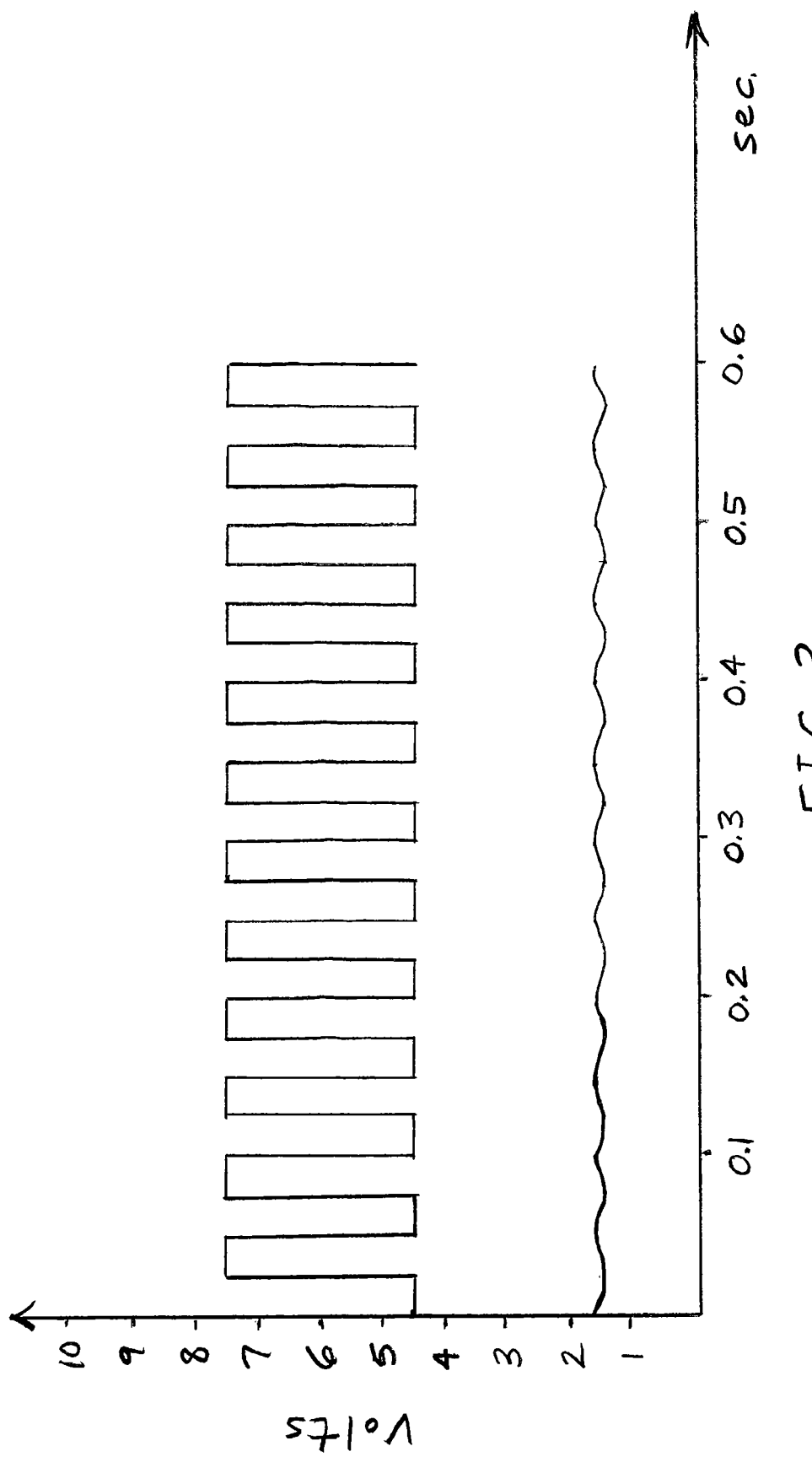
FIG. 3 is an example plot of the voltage waveforms at two nodes within the rectifier circuit of FIG. 2 with a low frequency audio signal as an input.

FIG. 3 illustrates two simulated waveforms using the circuit component values mentioned above. The lower one of the two plots is the output signal at a rectifier output node 44. This rectified output may barely exceed 1.2 Volts.

The audio signal applied to node 24 is the upper one of the two plots, and is in the form of a 20 Hz square wave having an amplitude of 3V peak-to-peak, centered around the typical automotive single-supply amplifier's mid-point bias of 6 VDC.

Figure 4:
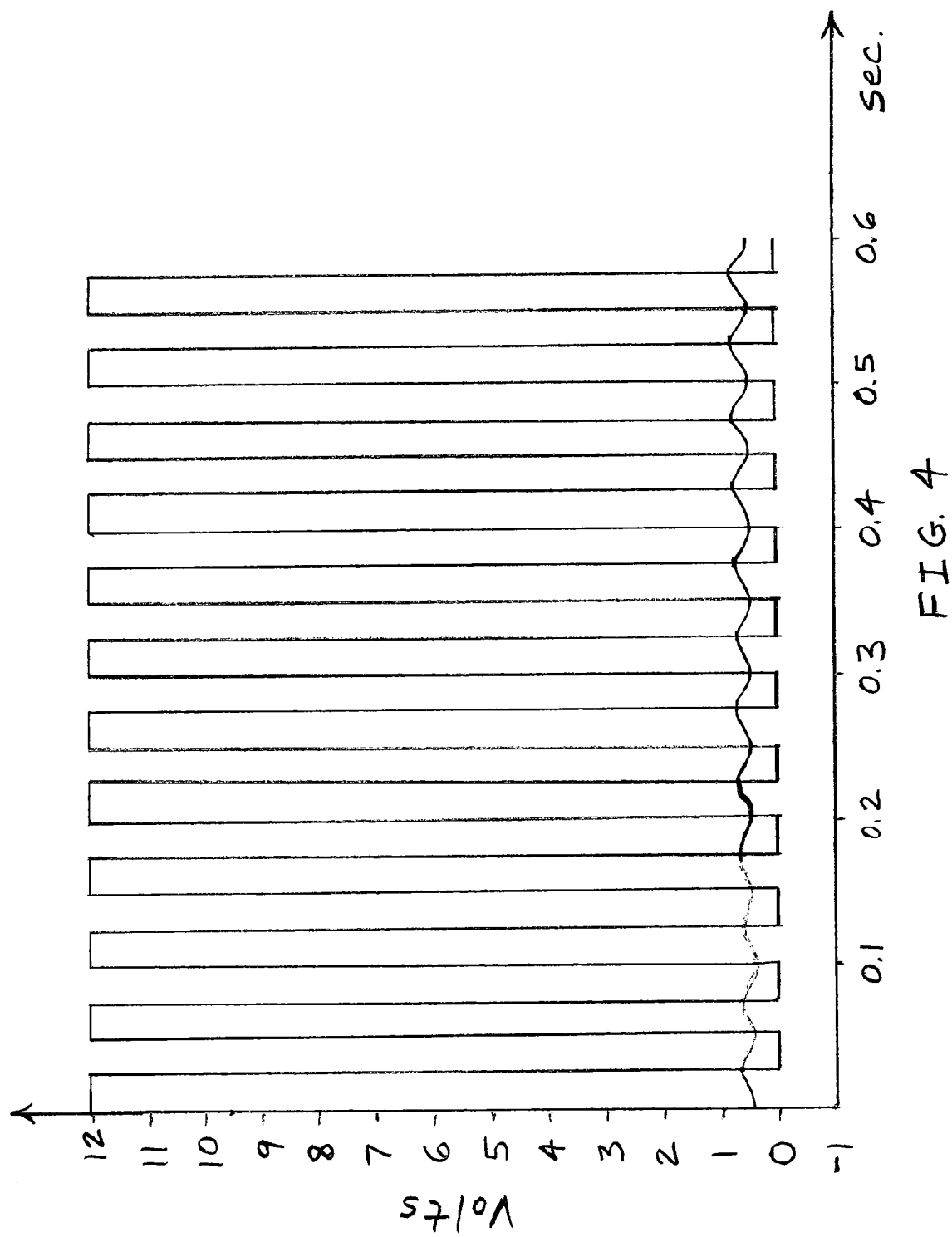
FIG. 4 is an example plot of the voltage waveforms at two nodes within the rectifier circuit of FIG. 2 with a full amplitude square wave as an input.

FIG. 4 illustrates a simulated "worst case" condition using the circuit component values mentioned above. The lower one of the two plots is the output signal at a rectifier output node 44. This rectified output may barely exceed 0.4 Volts.

The audio signal applied to node 24 is the upper one of the two plots, and is in the form of a full amplitude "rail-to-rail" 20 Hz square wave having an amplitude of 12V peak-to-peak, centered around the typical automotive single-supply amplifier's mid-point bias of 6 VDC. The characteristic charge/discharge of capacitor 40 is apparent and the rectifier output voltage does not exceed 1 VDC.

Figure 5:
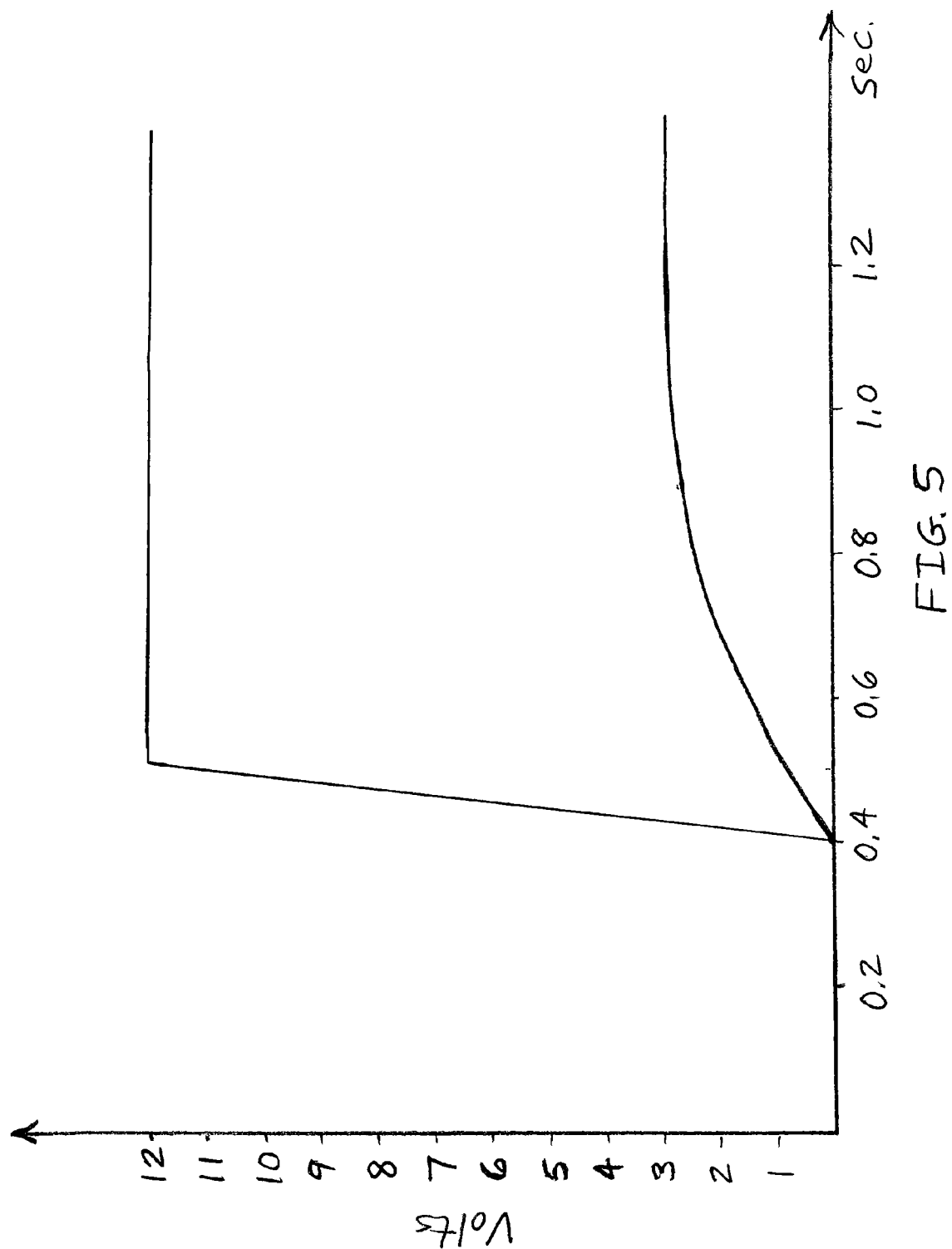
FIG. 5 is an example plot of the voltage waveforms at two nodes within the rectifier circuit of FIG. 2 in the presence of an input-short-to-ground fault condition.

Under the power amplifier input-short-to-ground fault condition, a constant DC voltage approximately equal to the vehicle battery voltage (roughly 9-16 volts) may be present at node 24. In this input-short-to-ground fault condition, capacitor 40 may again be charged through diode 36 and resistor 38, but there may not be any associated negative alternation of the signal to discharge capacitor 40 through diode 34. FIG. 5 illustrates the input-short-to-ground fault condition using the circuit component values mentioned above. The lower one of the two plots is the output signal at a rectifier output node 44. This rectified output may asymptotically rise to approximately 3 Volts after the fault condition appears. The audio signal applied to node 24 is the upper one of the two plots, and this voltage rises quickly to a constant DC voltage of 12 VDC after the fault condition appears.

The higher voltage at node 44, which may be characteristic of the input-short-to-ground fault condition, may be recognized via software, and the fault condition may be identified accordingly. Node 44 may be connected to a microcontroller 46 (FIG. 2) which includes an integral analog-to-digital converter, which is commonly present and available within a typical automotive head unit. Microcontroller 46 may monitor the voltage level at node 44 and may take appropriate action in order to protect the vehicle system's loudspeaker 26 in the event that an input-short-to-ground fault condition is detected by microcontroller 46. The action taken by microcontroller 46 to protect speaker 26 may include placing the entire audio power amplifier in a low-power stand-by mode; muting the affected channel; displaying an error message to notify the user of the fault condition; and/or setting a diagnostic trouble code (DTC) as notification to a service technician.

In a typical automotive arrangement, four rectifier circuits 30 may be provided. Each of the four circuits 30 may be associated with the front left speaker, the front right speaker, the rear left speaker, and the rear right speaker, respectively.

A square wave input is shown in FIGS. 3 and 4. However, it is also possible for the inputs to be sine waves of the same amplitudes and frequencies, and substantially the same output waveforms may be produced at node 44.

In another embodiment (not shown), diodes 34, 36 are replaced by a single dual-diode package, such as the Rohm DAN217. This has the advantage of reducing the parts count.

In yet another embodiment, a diode rectifier feeds a comparator circuit 48 (FIG. 2). Comparator circuit 48 may directly disable the audio power amplifier by forcing the audio power amplifier into stand-by mode without the aid of a microcontroller.

The method of the present invention differs from the DC offset detection mechanism of the prior art in two ways: 1) the output signal is directly measured, whereas prior art methods might measure the input signal, or may use internal diagnostics functions which are present only in more complex and expensive power ICs; and, 2) the inventive method reliably detects DC offset in the presence of input signals, whereas prior art methods typically work reliably only in the absence of applied input signals. Thus the present invention enables continuous monitoring for fault conditions during normal operation.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. An audio power amplifier arrangement, comprising:
   an audio power amplification circuit having two loudspeaker outputs;
   a first diode having a cathode connected to one of the two loudspeaker outputs and an anode connected to a rectifier output node;
   a second diode having an anode connected to the one loudspeaker output;
   a first resistor having a first end connected to a cathode of the second diode and a second end connected to the rectifier output node;
   a capacitor having a first end connected to the rectifier output node and a second end connected to electrical ground; and
   a second resistor having a first end connected to the rectifier output node and a second end connected to electrical ground.

2. The arrangement of claim 1 further comprising a microcontroller connected to the rectifier output node.

3. The arrangement of claim 2 wherein the microcontroller includes an integral analog-to-digital converter.

4. The arrangement of claim 2 wherein the microcontroller is configured to place the audio power amplification circuit in a low power stand by mode in response to detecting that a voltage at the rectifier output node is above a threshold level.

5. The arrangement of claim 4 wherein the threshold level is above two Volts.

6. The arrangement of claim 1 further comprising a comparator circuit connected to the rectifier output node.

7. The arrangement of claim 1 wherein a value of the capacitor is approximately between two microfarads and ten microfarads, and a value of the first resistor is approximately between 100,000 ohms and 200,000 ohms.

8. An audio power amplifier arrangement, comprising:
   an audio power amplification circuit having a loudspeaker output;
   a first diode having a cathode connected to the loudspeaker output and an anode connected to a rectifier output node;
   a second diode having an anode connected to the loudspeaker output;
   a resistor having a first end connected to a cathode of the second diode and a second end connected to the rectifier output node;
   a capacitor having a first end connected to the rectifier output node and a second end connected to electrical ground; and
   means for detecting that a voltage at the rectifier output node is above a threshold level.

9. The arrangement of claim 8 further comprising means for removing voltage from the loudspeaker output in response to the detecting means detecting that the voltage at the rectifier output node is above the threshold level.

10. The arrangement of claim 9 wherein the removing means comprises a microcontroller.

11. The arrangement of claim 8 wherein the resistor comprises a first resistor, the rectifier circuit further comprising a second resistor having a first end connected to the rectifier output node and a second end connected to electrical ground.

12. The arrangement of claim 8 wherein the detecting means comprises a microcontroller.

13. The arrangement of claim 12 wherein the microcontroller includes an integral analog-to-digital converter.

14. The arrangement of claim 8 wherein the detecting means comprises a comparator circuit.

15. A method of processing an audio signal, comprising the steps of:
   inputting the audio signal into a power amplification circuit having a power amplification circuit output;
   connecting a rectifier circuit to the power amplification circuit output, the rectifier circuit including:
   a first diode having a cathode connected to the output and an anode connected to a rectifier output;
   a second diode having an anode connected to the power amplification circuit output;
   a resistor having a first end connected to a cathode of the second diode and a second end connected to the rectifier output; and
   a capacitor having a first end connected to the rectifier output and a second end connected to electrical ground; and
   detecting that a voltage at the rectifier output is above a threshold level.

16. The method of claim 15 comprising the further step of removing voltage from the power amplification circuit output in response to the detecting that the voltage at the rectifier output is above the threshold level.

17. The method of claim 15 wherein the resistor comprises a first resistor, the rectifier circuit further comprising a second resistor having a first end connected to the rectifier output and a second end connected to electrical ground.

18. The method of claim 15 comprising the further step of placing the power amplification circuit in a low power stand by mode in response to the detecting that the voltage at the rectifier output is above the threshold level.

19. The method of claim 15 comprising the further step of muting an associated audio channel in response to the detecting that the voltage at the rectifier output is above the threshold level.

20. The method of claim 19 comprising the further steps of:
   charging the capacitor through the second diode and the resistor; and
   discharging the capacitor through the first diode.

* * * * *